United States Patent
Nozu

(10) Patent No.: US 8,981,462 B2
(45) Date of Patent: Mar. 17, 2015

(54) SEMICONDUCTOR DEVICE

(71) Applicant: Kabushiki Kaisha Toshiba, Tokyo (JP)

(72) Inventor: Tetsuro Nozu, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/017,231

(22) Filed: Sep. 3, 2013

(65) Prior Publication Data

US 2014/0284700 A1 Sep. 25, 2014

(30) Foreign Application Priority Data

Mar. 25, 2013 (JP) .................... 2013-061334

(51) Int. Cl.
*H01L 29/40* (2006.01)
*H01L 29/78* (2006.01)

(52) U.S. Cl.
CPC .......... *H01L 29/407* (2013.01); *H01L 29/7813* (2013.01)
USPC ........................................ 257/328

(58) Field of Classification Search
CPC ............ H01L 29/7813; H01L 29/4236; H01L 29/66704; H01L 29/7825; H01L 29/7397
USPC ........................................ 257/328
See application file for complete search history.

(56) References Cited

U.S. PATENT DOCUMENTS

| 4,398,339 A | * | 8/1983 | Blanchard et al. ............ 438/271 |
| 5,225,698 A | * | 7/1993 | Kim et al. ..................... 257/303 |
| 6,586,833 B2 | | 7/2003 | Baliga |
| 7,371,641 B2 | | 5/2008 | Montgomery |
| 2002/0060339 A1 | | 5/2002 | Maruoka |
| 2011/0303925 A1 | | 12/2011 | Nishimura |
| 2012/0199899 A1 | | 8/2012 | Kobayashi et al. |
| 2013/0240985 A1 | * | 9/2013 | Hirler et al. .................. 257/330 |

FOREIGN PATENT DOCUMENTS

| JP | H07131010 A | 5/1995 |
| JP | 2002158355 A | 5/2002 |
| JP | 2007129134 A | 5/2007 |
| JP | 2008519436 A | 6/2008 |
| JP | 2011258834 A | 12/2011 |
| JP | 2012164916 A | 8/2012 |

OTHER PUBLICATIONS

Yung C. Liang, Ganesh S. Samudra, Power Microelectronics, World Scientific, 2009, 1 page.

* cited by examiner

*Primary Examiner* — Marc Armand
(74) *Attorney, Agent, or Firm* — Patterson & Sheridan, LLP

(57) ABSTRACT

According to one embodiment, a semiconductor device includes a semiconductor layer having an opening formed therein, a first insulating layer disposed on a bottom surface of the opening and on a sidewall of the opening, a second insulating layer disposed on the sidewall of the opening above the first insulating layer, the second insulating layer being thinner than the first insulating layer, a field plate electrode disposed on the first insulating layer and the second insulating layer and having a recess extending from an upper surface of the field plate electrode towards the bottom surface of the opening, and a first layer disposed in the recess and including a material that is different from a material of the field plate electrode.

20 Claims, 9 Drawing Sheets

US 8,981,462 B2

SEMICONDUCTOR DEVICE

CROSS-REFERENCE TO RELATED APPLICATION

This application is based upon and claims the benefit of priority from Japanese Patent Application No. 2013-061334, filed Mar. 25, 2013, the entire contents of which are incorporated herein by reference.

FIELD

An embodiment described herein relates generally to a semiconductor device.

BACKGROUND

With demand for high-efficiency energy-saving technologies increasing in recent years, MOSFETs are required to have smaller size, higher breakdown voltage, lower on-resistance, and lower capacitance. To meet these requirements, technologies of embedding field plate electrodes made of polysilicon in trench structures are attracting attention. For example, a Tunable Oxide Bypass U-MOSFET (TOBU-MOS) can provide low on-resistance while having high breakdown voltage.

To use polysilicon in a trench structure as an electrode, the polysilicon layer needs to be doped with a high concentration of impurities. Phosphorus atoms are therefore introduced into the polysilicon layer by thermal treatment in an atmosphere of $H_3POCl$. However, this treatment generally causes the phosphorus atoms to be excessively introduced into the polysilicon layer, resulting in volume expansion. The volume expansion applies a high stress to layers adjacent to the field plate electrode, causing dislocations or the like in those layers. Further, the volume expansion causes a top surface of the field plate electrode to protrude or bulge, which prevents the area of contact between an upper layer thereof and the field plate electrode from being consistent.

DETAILED DESCRIPTION

A semiconductor device, according to an embodiment, includes a semiconductor layer having an opening formed therein, a first insulating layer disposed on a bottom surface of the opening and on a sidewall of the opening, a second insulating layer disposed on the sidewall of the opening above the first insulating layer, the second insulating layer being thinner than the first insulating layer, a field plate electrode disposed on the first insulating layer and the second insulating layer and having a recess extending from an upper surface of the field plate electrode towards the bottom surface of the opening, and a first layer disposed in the recess and including a material that is different from a material of the field plate electrode.

Figure 1A:
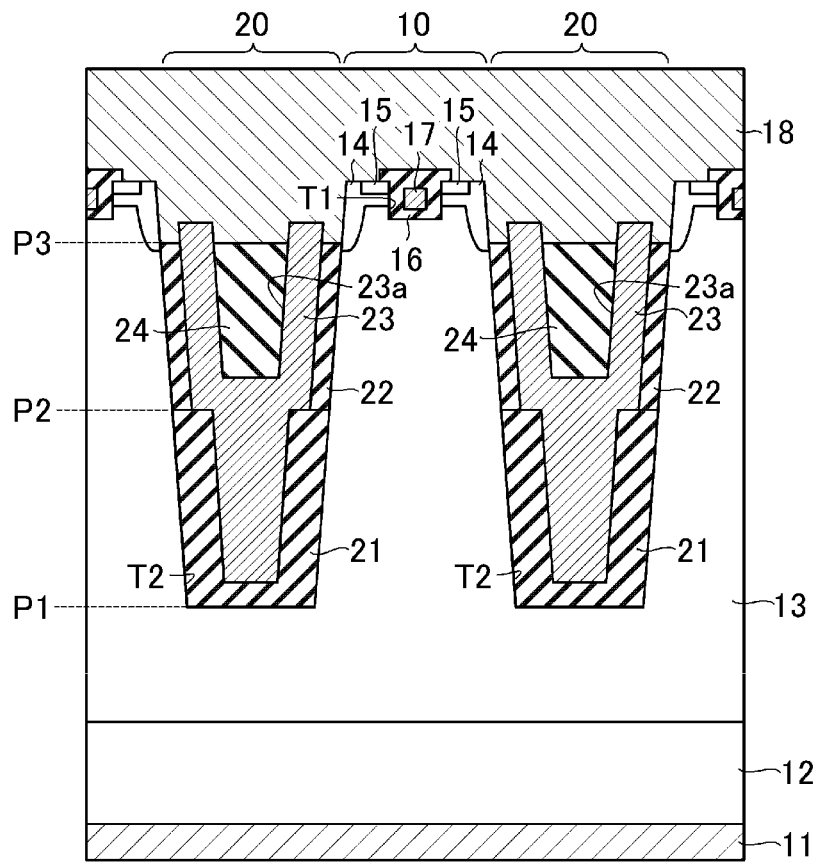
FIG. 1A is a cross-sectional view illustrating a semiconductor device according to an embodiment.
Figure 1B:
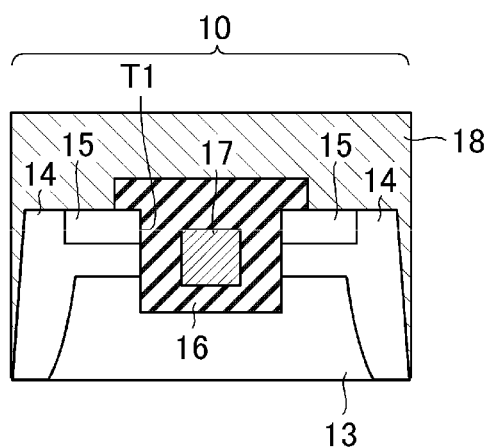
FIG. 1B is an enlarged cross-sectional view of a device region shown in FIG. 1A.

With reference to FIGS. 1A and 1B, a semiconductor device according to an example embodiment will be described below. FIG. 1A is a cross-sectional view illustrating the semiconductor device according to the embodiment. FIG. 1B is an enlarged cross-sectional view of a device region 10 shown in FIG. 1A. As shown in FIG. 1A, the semiconductor device according to the embodiment includes a device region 10 in which a MOSFET is formed and a pair of adjacent regions 20 that are adjacently provided to sandwich the device region 10 and mitigate electric field concentration.

As shown in FIGS. 1A and 1B, the device region 10 includes a drain electrode 11, an n+-type semiconductor substrate 12, and an n-type epitaxial layer 13. In this embodiment, an n+ type has a higher impurity concentration than an n-type.

The semiconductor substrate 12 is provided on the drain electrode 11. The epitaxial layer 13 is provided on the semiconductor substrate 12. The epitaxial layer 13 serves as a drain of the MOSFET. For example, the concentration of arsenic (As) in the semiconductor substrate 12 is $2 \times E19$ $cm^{-3}$, and the As concentration in the epitaxial layer 13 is $1 \times E16$ $cm^{-3}$. For example, the thickness of the epitaxial layer 13 is 15 μm.

Further, the device region 10 includes, as shown in FIGS. 1A and 1B, a pair of p-type base regions 14, a pair of n-type source regions 15, a gate insulating film 16, a gate electrode 17, and a source electrode 18.

The base regions 14 serve as a body (channel) of the MOSFET. The base regions 14 are formed on a top surface of the epitaxial layer 13. The source regions 15 serve as a source of the MOSFET. The source regions 15 are formed on top surfaces of the base regions 14.

The gate electrode 17 serves as a gate of the MOSFET. The gate insulating film 16 and the gate electrode 17 are provided in a trench T1. The trench T1 is formed to extend into the epitaxial layer 13. The gate insulating film 16 is formed on the bottom and the side of the trench T1 with predetermined thicknesses. The gate electrode 17 is embedded in the trench T1, with the gate insulating film 16 surrounding the gate electrode 17. The gate electrode 17 is formed between the pair of source regions 15 and the pair of base regions 14. The source electrode 18 contacts top surfaces of the source regions 15.

As shown in FIG. 1A, the adjacent regions 20 include the drain electrode 11, the semiconductor substrate 12, and the epitaxial layer 13 that extend from the device region 10. In each of the adjacent regions 20, a trench T2 is provided. The trench T2 is formed to extend into the epitaxial layer 13 and the base region 14. The trench T2 may, for example, be formed by a subtractive process such as etching. For example, the width of the trench T2 at the level of the opening in the epitaxial layer 13 is 4 μm.

The adjacent regions 20 each include, as shown in FIG. 1A, insulating layers 21 and 22, a field plate electrode 23, and an insulating layer 24 in the trench T2.

The insulating layer 21 is formed along the side of the trench T2 from the bottom (position P1) of the trench T2 to a position P2 above the bottom. Specifically in this embodiment, the insulating layer 21 is formed from the position P1 to the position P2 in the epitaxial layer 13 on both sidewalls of the trench T2. Insulating layer 21 is also formed on the bottom wall of the trench T2. The insulating layer 22 is formed along the side of the trench T2 from the position P2 to a position P3 above the position P2. Specifically in this embodiment, the insulating layer 22 is formed on both sidewalls of trench T2 from the position P2 to the position P3 in the epitaxial layer 13. The thickness of the insulating layer 22 is less than the thickness of the insulating layer 21. The distance between portions of insulating layer 22 on opposite sidewalls (that is, the cross-sectional width of trench T2 that is not filled by the insulating layer 22, which may be referred to as the inside diameter of the insulating layer 22) is larger than the distance between portions of insulating layer 21 on opposite sidewalls (that is, the cross-sectional width of trench T2 that is not filled by the insulating layer 21, which may be referred to as the inside diameter of the insulating layer 21). In this embodiment, the position P2 is located at a depth of ¼ to ½ of the depth of the trench T2. The insulating layers 21 and 22 are made of silicon oxide, for example. In this example, the thickness of the insulating layer 21 is 1.8 µm, and the thickness of the insulating layer 22 is 0.5 µm. That is, the thickness of the insulating layer 21 in a lower portion of the trench T2 is greater than the thickness of the insulating layer 22 in an upper portion of the trench T2.

The field plate electrode 23 is formed in a Y-shape in a cross-sectional view shown in FIG. 1A. In other words, the insulating layer 21 is thicker than the insulating layer 22, and the inside diameter of the insulating layer 22 is larger than the inside diameter of the insulating layer 21. Consequently, the field plate electrode 23 is formed in the Y-shape. The field plate electrode 23 abuts the trench T2 sidewalls with the insulating layers 21 and 22 with different thicknesses interposed therebetween. The field plate electrode 23 is provided between the insulating layers 21 and 22 with a recess 23a in an upper portion. The field plate electrode 23, in this example, is made of polysilicon including phosphorus atoms. For example, the thickness of the field plate electrode 23 is 0.5 µm.

The insulating layer 24 is provided in the recess 23a. For example, the insulating layer 24 is made of silicon oxide.

Further, the adjacent regions 20 each have the source electrode 18 extending from the device region 10. In each of the adjacent region 20, the source electrode 18 covers the trench T2. The source electrode 18 contacts top surfaces of the insulating layers 22 and 24 and the field plate electrode 23.

Figure 2A:
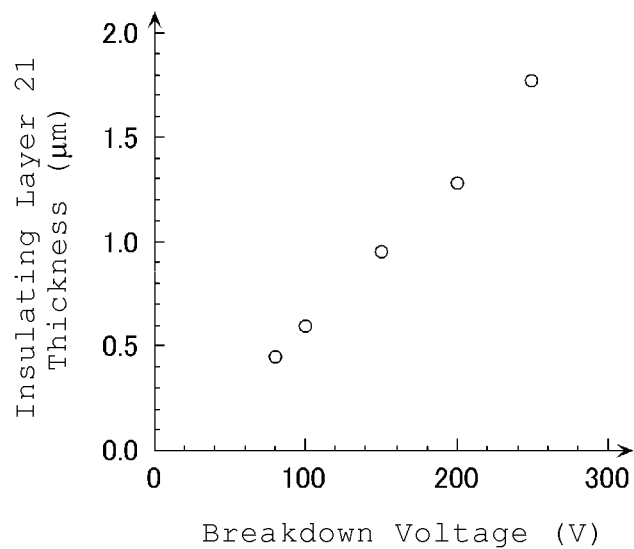
FIG. 2A is a graph depicting the breakdown voltage of the semiconductor device according to an embodiment for various thicknesses of an insulating layer.

Next, with reference to FIG. 2A, a relationship between the breakdown voltage of the semiconductor device and the thickness of the insulating layer 21 will be explained. The horizontal axis in FIG. 2A shows the breakdown voltage of the semiconductor device, and the vertical axis in FIG. 2A shows the thickness of the insulating layer 21. As shown in FIG. 2A, as the thickness of the insulating layer 21 is increased, the breakdown voltage of the semiconductor device increases because electric field concentration that is the largest at the trench bottom is mitigated. For example, when the thickness of the insulating layer 21 is approximately 1.8 µm, the breakdown voltage is approximately 250 V.

Figure 2B:
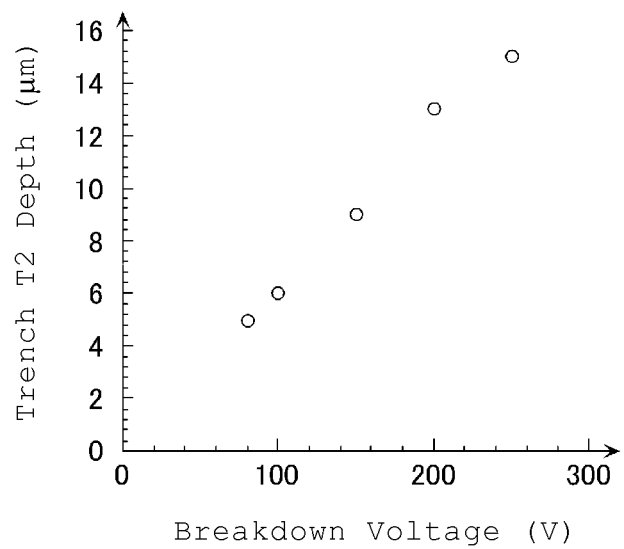
FIG. 2B is a graph depicting the breakdown voltage of the semiconductor device according to an embodiment for various depths of a trench.

Next, with reference to FIG. 2B, a relationship between of the breakdown voltage of the semiconductor device and the depth of the trench T2 will be explained. The horizontal axis in FIG. 2B shows the breakdown voltage of the semiconductor device, and the vertical axis in FIG. 2B shows the depth of the trench T2. As shown in FIG. 2B, as the depth of the trench T2 is increased, the breakdown voltage of the semiconductor device increases because electric field concentration is mitigated.

Next, with reference to FIGS. 3 to 16, a method of manufacturing the semiconductor device according to this embodiment will be described.

Figure 3:
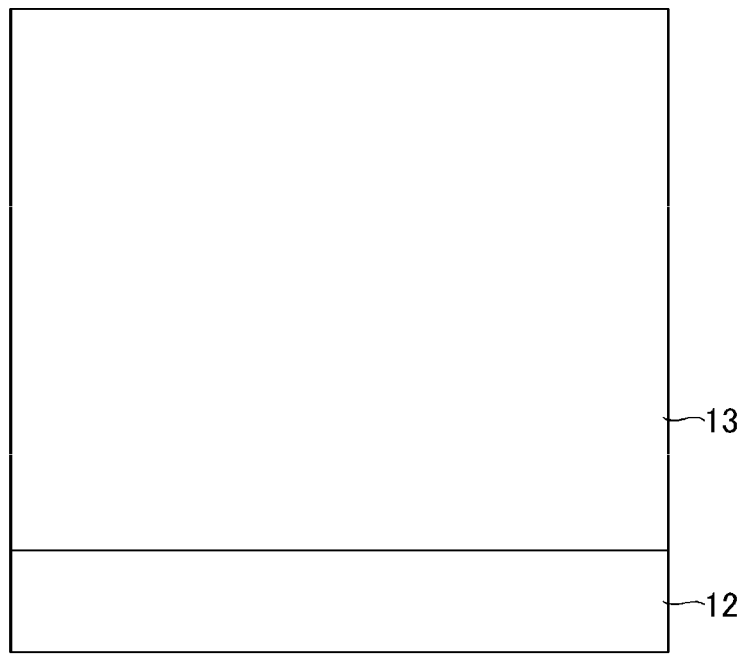
FIGS. 3-16 are cross-sectional views illustrating steps in the manufacturing of a semiconductor device according to an embodiment.
Figure 4:
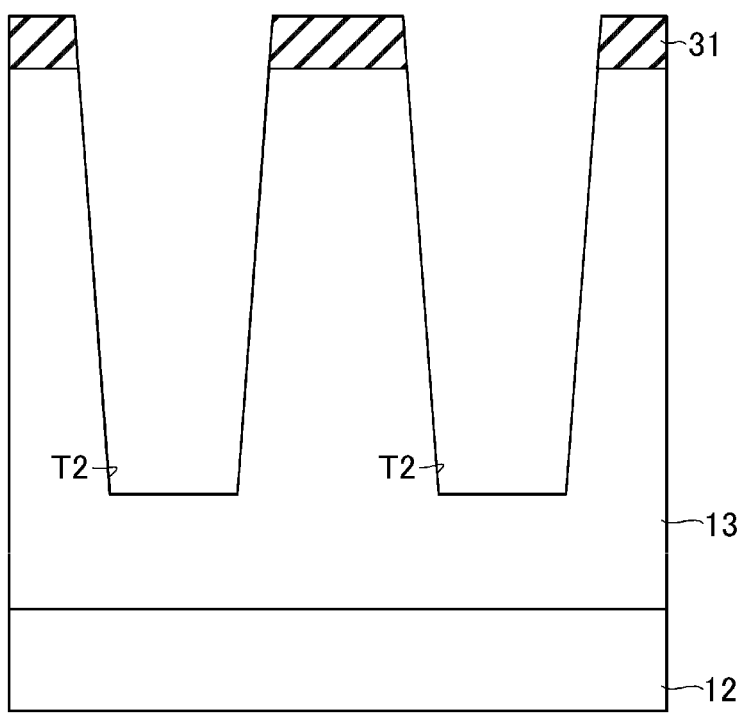

First, as shown in FIG. 3, the epitaxial layer 13 is grown on the semiconductor substrate 12. Then, as shown in FIG. 4, the trenches T2 are formed in the epitaxial layer 13 at predetermined intervals. During formation of the trenches T2, an insulating layer 31 formed on the epitaxial layer 13 is used as a mask.

Figure 5:
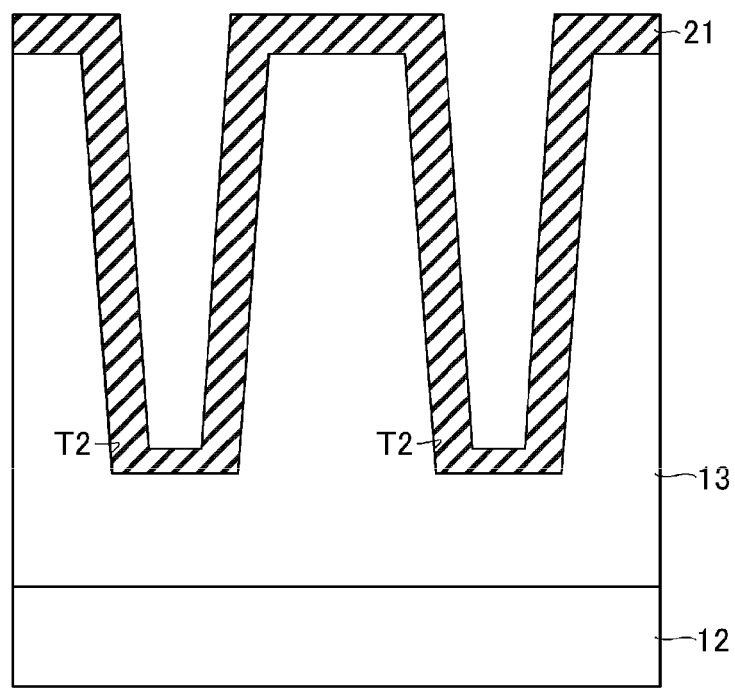
Figure 6:
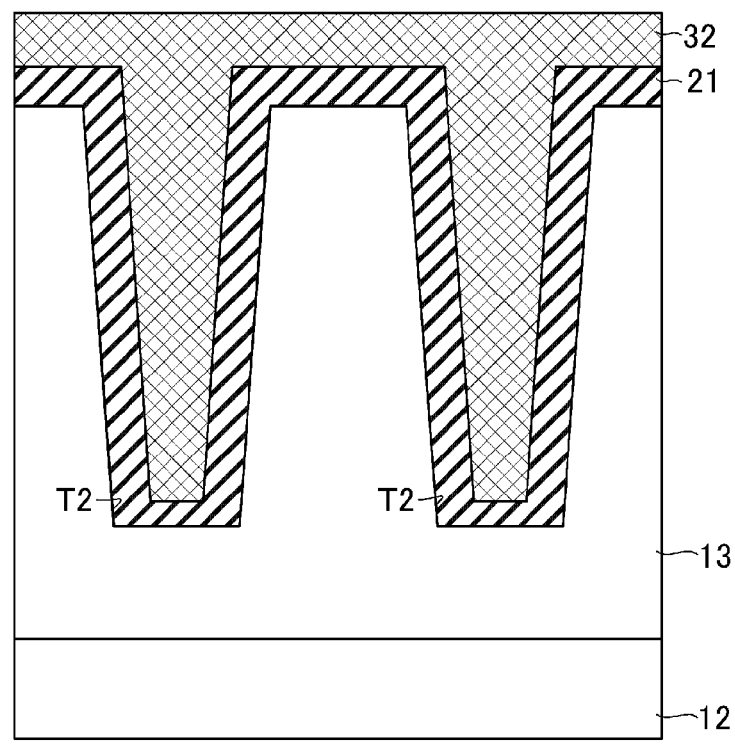
Figure 7:
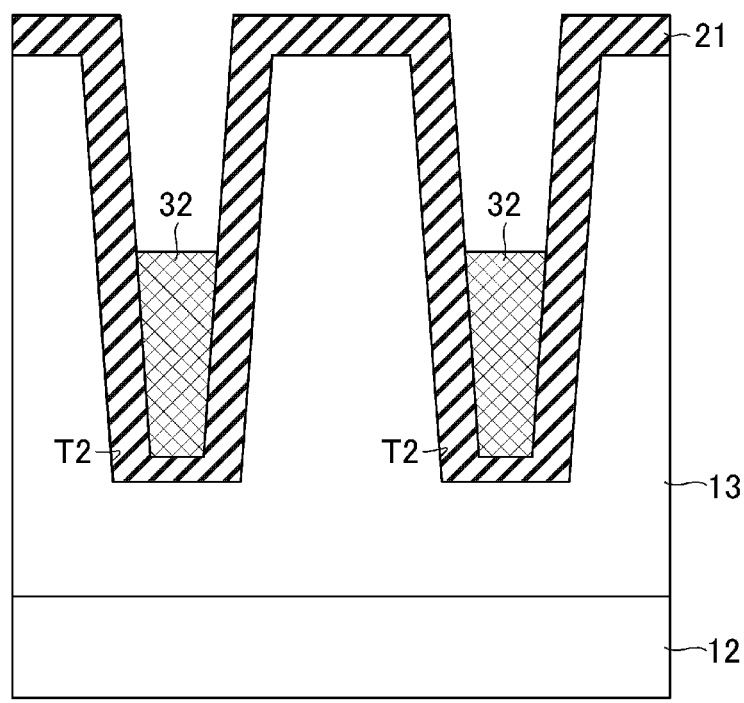

Following that, as shown in FIG. 5, the insulating layer 21 is formed to cover the trenches T2. The insulating layer 21 is formed on the sidewalls and the bottom wall of the trenches T2. For example, the thickness of the insulating layer 21 is 1.8 µm. Next, as shown in FIG. 6, a resist 32 is formed to cover a top surface of the insulating layer 21. Then, as shown in FIG. 7, the resist 32 is removed to ¼ to ½ of the depth of the trenches T2.

Figure 8:
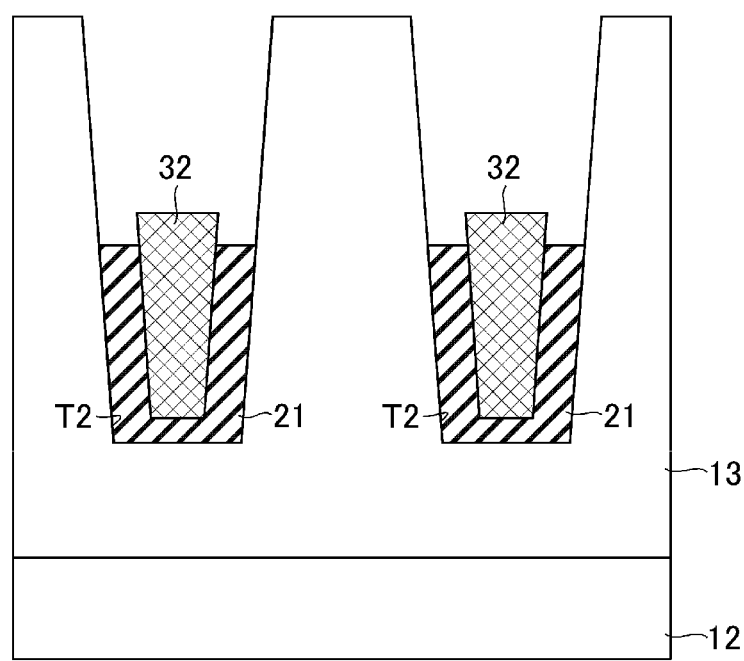
Figure 9:
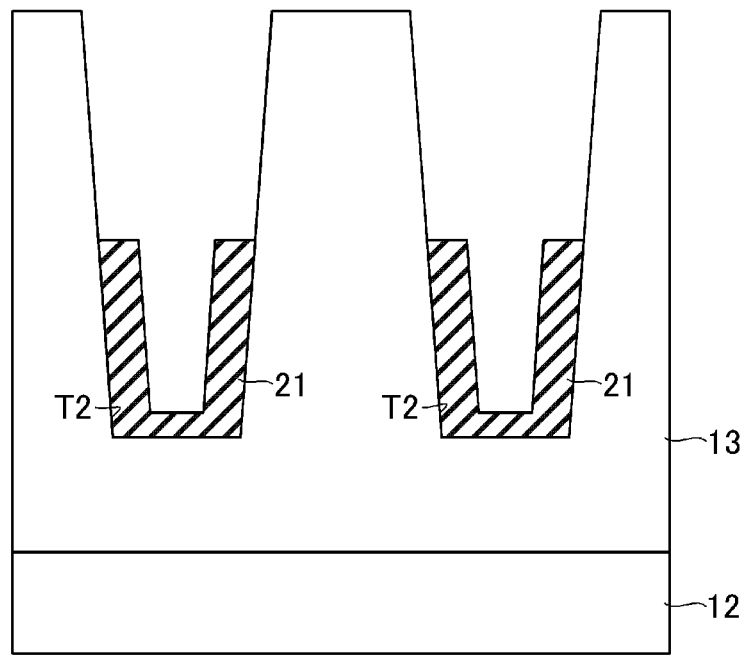

Next, as shown in FIG. 8, using the resist 32 as a mask, upper portions of the insulating layer 21 are removed. Then, as shown in FIG. 9, the resist 32 is removed using sulfuric acid and hydrogen peroxide solution.

Figure 10:
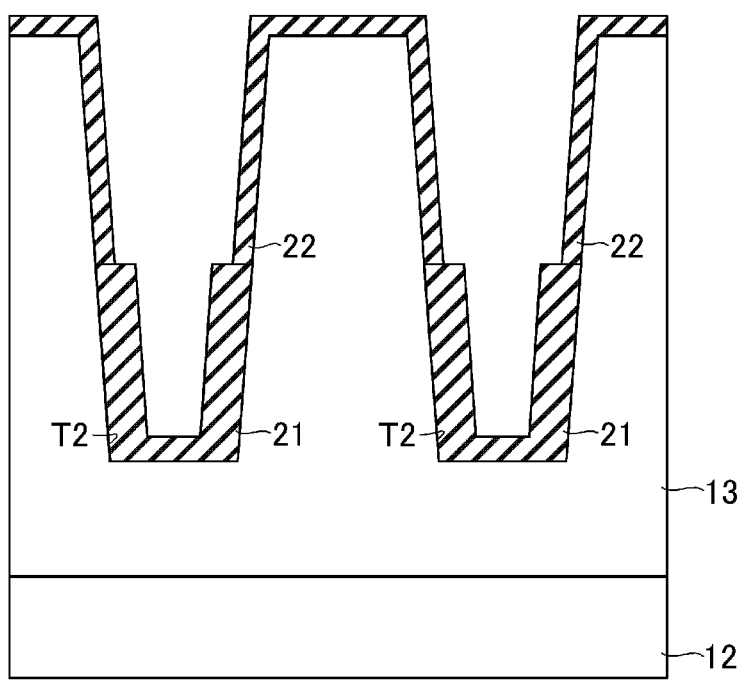

Next, as shown in FIG. 10, the insulating layers 22 are formed to contact top surfaces of the insulating layers 21. The insulating layers 22 are formed in a tubular shape abutting the sidewalls of the trenches T2. Further, the insulating layers 22 are formed thinner than the insulating layers 21. For example, the thickness of the insulating layers 22 is 0.5 µm.

Figure 11:
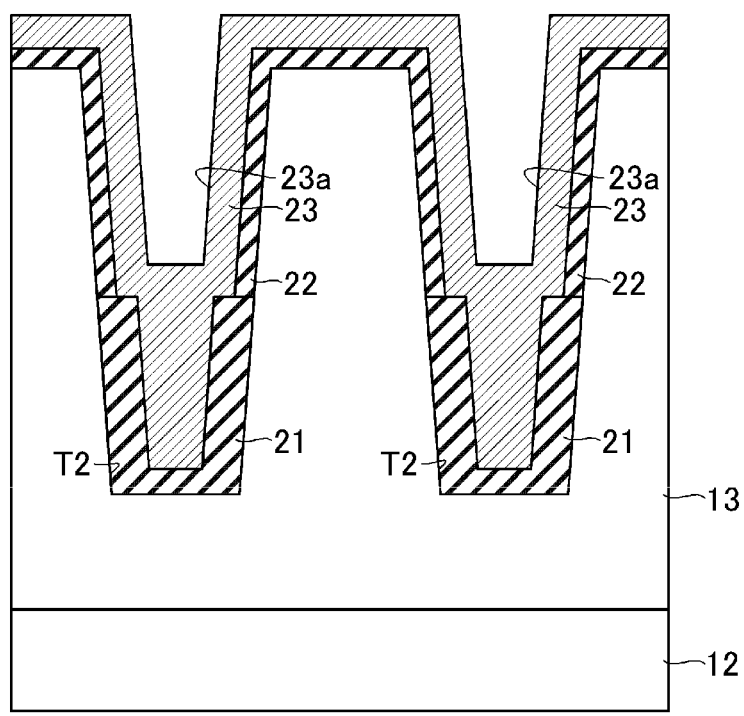

Then, as shown in FIG. 11, the field plate electrodes 23 are formed to cover top surfaces of the insulating layers 21 and 22. Specifically, polysilicon is deposited, and then phosphorus atoms are diffused in the polysilicon in an atmosphere of $POCl_3$, thereby forming the field plate electrodes 23. Here, the insides of the insulating layers 21 are completely filled with the field plate electrodes 23, while the insides of the insulating layers 22 are not completely filled therewith. The field plate electrodes 23 each have the recess 23a in an upper portion thereof.

Figure 12:
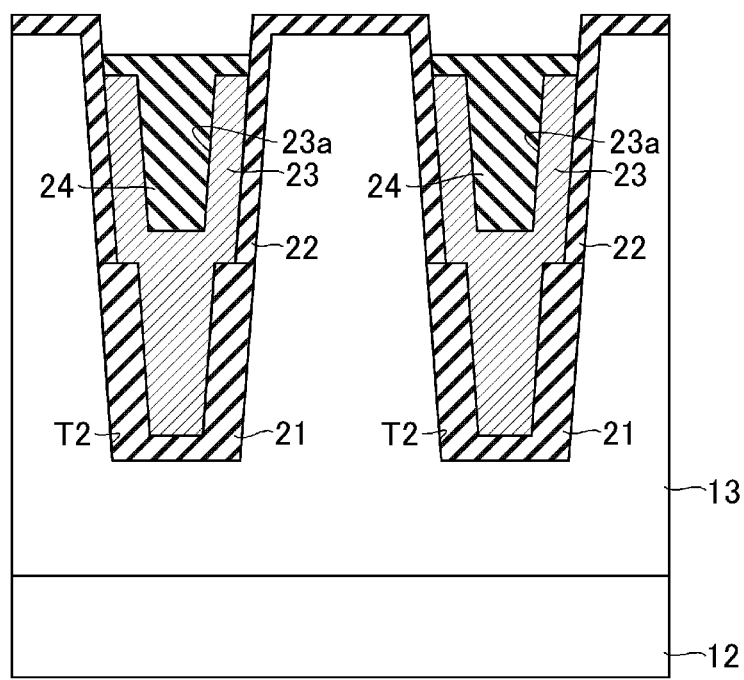
Figure 13:
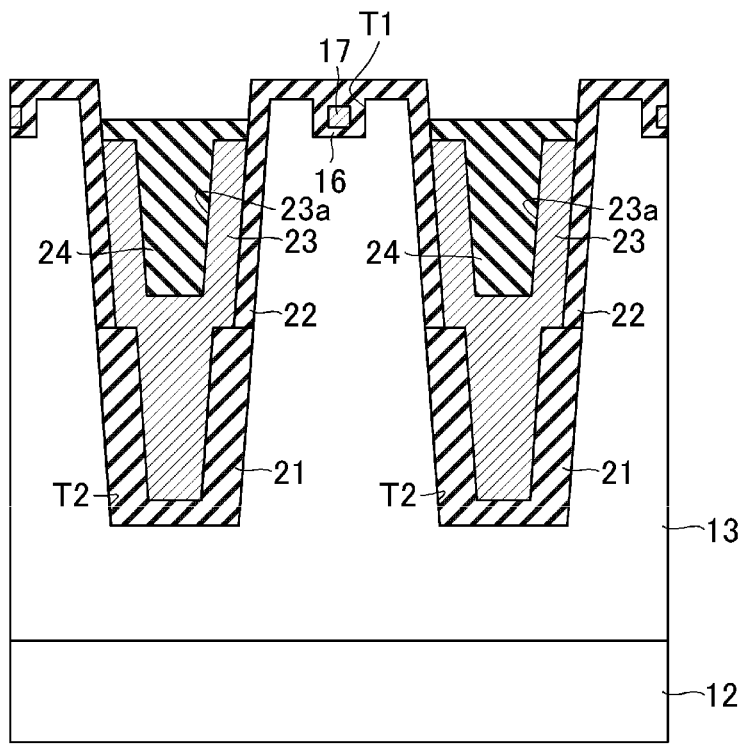

Next, as shown in FIG. 12, the field plate electrodes 23 are removed to a predetermined depth, and then the insulating layers 24 are formed in the recesses 23a. Then, as shown in FIG. 13, in a region between the trenches T2, the epitaxial layer 13 is etched to form the trench T1. In the trench T1, the gate electrode 17 is formed with the gate insulating layer 16 interposed therebetween.

Figure 14:
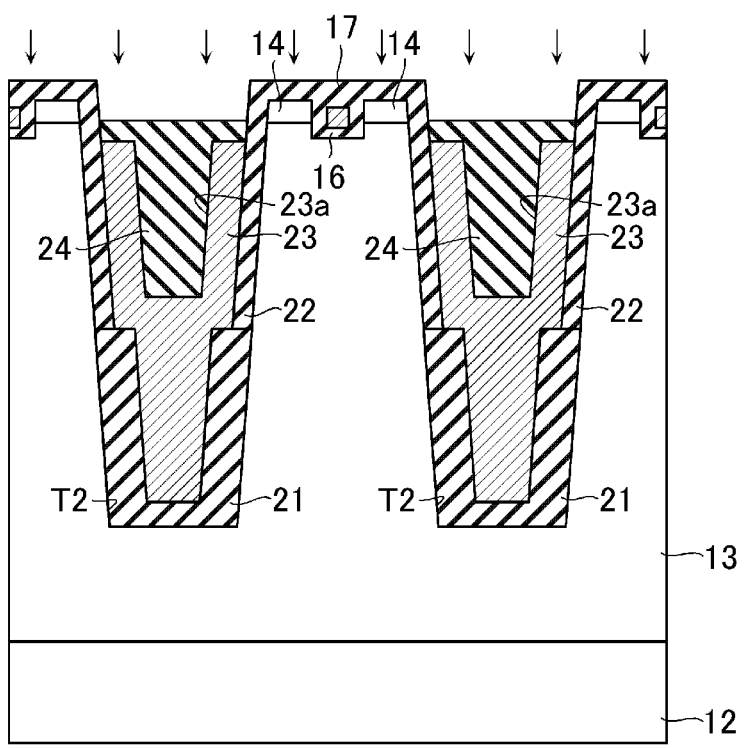
Figure 15:
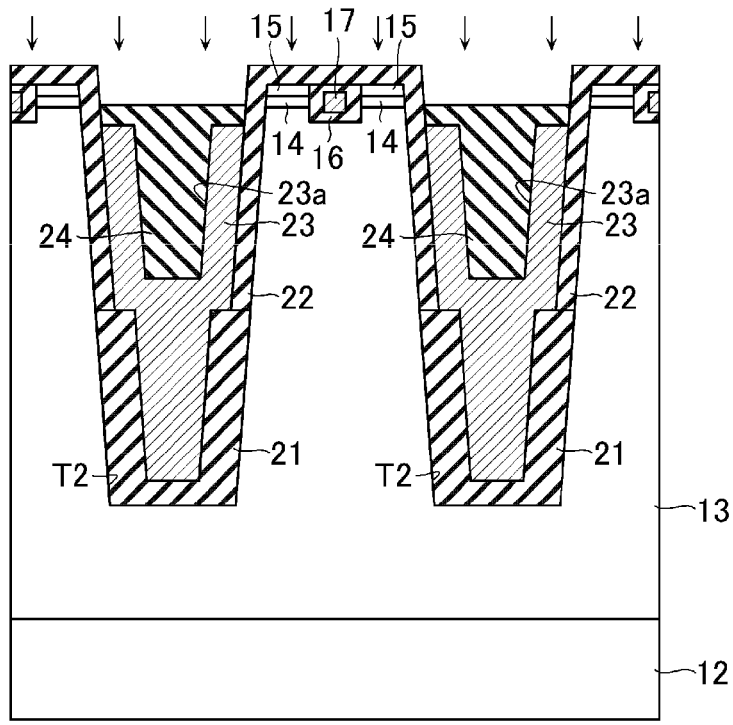

Next, as shown in FIG. 14, boron (B) ions are implanted into top surfaces of the epitaxial layer 13 between the trench T1 and the trenches T2 to form the base regions 14. Then, as shown in FIG. 15, phosphorus (P) ions are implanted into top surfaces of the base regions 14 (epitaxial layer 13), which is followed by a heat treatment. Through these steps, the source regions 15 are formed on the top surfaces of the base regions 14.

Figure 16:
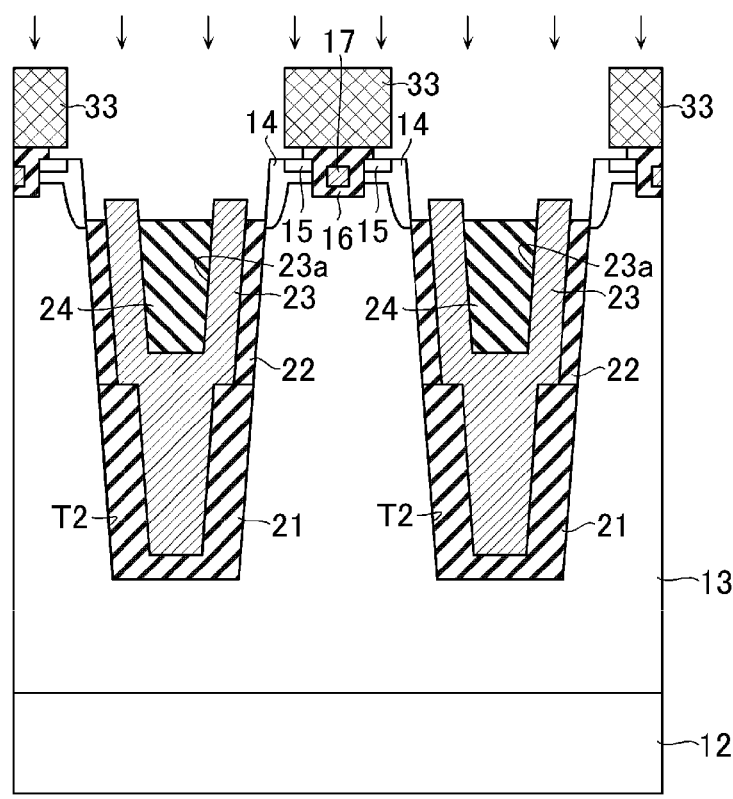

Next, as shown in FIG. 16, the insulating layers 22 and 24 and the field plate electrodes 23 are etched to predetermined depths, and a resist 33 is formed above the source regions 15 and the gate electrode 17. Then, boron (B) ions are implanted through the resist 33, which is followed by a heat treatment. Through these steps, the base regions 14 extend to a position deeper than the undersurface of the gate electrode 17. Here, the top surfaces of the field plate electrodes 23 are exposed to boron ions. However, the field plate electrodes 23 sufficiently include phosphorus ions through the step shown in FIG. 11, thus maintaining low resistance.

After the step shown in FIG. 16, the resist 33 is removed, and the drain electrode 11 and the source electrode 18 are formed. Through the above steps, the semiconductor device shown in FIG. 1A is manufactured.

In the above embodiment, the field plate electrodes 23 energized from the source electrode 18 allow the MOSFET to have a lower on-resistance. Further, since the insulating layers 21 are thicker than the insulating layers 22 at the bottoms of the trenches T2, at which electric field concentration becomes large, the semiconductor device according to the embodiment has a higher breakdown voltage.

Here, as a comparative example, suppose that the field plate electrodes 23 are not in the Y shape but are shaped to fill the trenches T2 completely. In this comparative example, polysilicon layer forming the field plate electrodes 23 expands by being doped with phosphorus atoms. This volume expansion applies high stress to the insulating layers 21 and 22 and the epitaxial layer 13 that are adjacent to the field plate electrodes 23, causing dislocations or the like therein. Moreover, the top surfaces of the field plate electrodes 23 protrude, thus preventing the areas of contact between the source electrode 18 and the field plate electrodes 23 from being consistent.

Accordingly, in this embodiment, the field plate electrodes 23 are formed in the Y shape and have the recesses 23a in the upper portions. Then, the insulating layers 24 are provided in the recesses 23a of the field plate electrodes 23. Consequently, compared to the comparative example, lower stress is applied to the insulating layers 21 and 22 and the epitaxial layer 13, thus preventing occurrence of dislocations or the like. Further, compared to the comparative example, the top surfaces of the field plate electrodes 23 are prevented from protruding, which allows the areas of contact between the source electrode 18 and the field plate electrodes 23 to be consistent. Thus high reliability is ensured. Moreover, the field plate electrodes 23 and the source electrode 18 are connected directly to each other on the field plate electrodes 23, which eliminates the need for providing leads for connecting the field plate electrodes 23 and the source electrode 18. This enables a reduced footprint.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the device region 10, other than the MOSFET, a semiconductor device such as an IGBT may be provided. Further, in place of the insulating layers 24, metal layers may be formed in the recesses 23a.

What is claimed is:

1. A semiconductor device, comprising:
   a semiconductor layer between a first electrode and a second electrode and having a first recess extending from a first electrode side of the semiconductor layer toward a second electrode side of the semiconductor layer;
   a first insulating layer disposed on a bottom surface of the first recess and on a sidewall of the first recess;
   a second insulating layer disposed on the sidewall above the first insulating layer, the second insulating layer being thinner than the first insulating layer in a direction orthogonal to the sidewall;
   a field plate electrode disposed on the first insulating layer and the second insulating layer and having a second recess that extends from an upper surface of the field plate electrode towards the bottom surface of the first recess;
   a first layer disposed in the second recess and including a material that is different from a material of the field plate electrode;
   a gate electrode on the first electrode side of the semiconductor layer and spaced from the semiconductor layer by a third insulating layer; and
   a contact region in the semiconductor layer adjacent to the first recess, the contact region being in direct electrical contact with the first electrode and between the sidewall of the first recess and the gate electrode.

2. The semiconductor device according to claim 1, wherein the field plate electrode is primarily polysilicon.

3. The semiconductor device according to claim 1, wherein the first layer is an insulator.

4. The semiconductor device according to claim 1, wherein the first layer is a metal.

5. The semiconductor device according to claim 1, wherein the first layer is below a level of the upper surface of the field plate electrode and above a level at which the first insulating layer and the second insulating are in contact with each other.

6. The semiconductor device according to claim 1, wherein the first recess is a trench.

7. The semiconductor device according to claim 1, wherein a metal-oxide-semiconductor field effect transistor (MOSFET) is disposed in a region of the semiconductor layer adjacent to the sidewall of the first recess.

8. The semiconductor device according to claim 1, wherein the field plate electrode has a portion that extends into the source electrode and the field plate electrode and the source electrode are in direct electrical contact at the portion.

9. The semiconductor device according to claim 2, wherein the field plate electrode is doped with phosphorus atoms.

10. A method for manufacturing a semiconductor device, comprising:
    forming a first recess in a semiconductor layer, the first recess extending in a first direction from a first side of the semiconductor layer toward a second side opposite the first side;
    forming a first insulating layer on a bottom surface of the first recess and on a sidewall of the first recess,
    forming a second insulating layer on the sidewall of the opening above the first insulating layer, the second insulating layer being thinner than the first insulating layer in a direction orthogonal to the sidewall;
    forming a field plate electrode on the first insulating layer and the second insulating layer, the field plate electrode having a second recess that extends in the first direction from an upper surface of the field plate electrode towards the bottom surface of the first recess;
    forming a first layer in the second recess, the first layer including a material that is different from a material of the field plate electrode;
    forming a contact region in the semiconductor layer adjacent to the first recess; and
    forming a gate electrode on the first side of the semiconductor layer and spaced from the semiconductor layer by a third insulating layer, the gate electrode disposed such that the contact region is between the sidewall of the first recess and the gate electrode.

11. The method according to claim 10, wherein the first recess in the semiconductor layer is formed using a subtractive process.

12. The method according to claim 10, wherein the semiconductor layer is formed by an epitaxial process and an insulating material is used as mask for forming the first recess.

13. The method according to claim 10, wherein the field plate electrode is primarily polysilicon.

14. The method according to claim 10, further comprising:
forming a first electrode on the first side of the semiconductor layer; and
forming a second electrode on the second side of the semiconductor layer.

15. The method according to claim 13, wherein the forming of the field plate electrode includes a step of doping a material with phosphorus atoms.

16. A semiconductor device, comprising:
a first electrode on a first side of a semiconductor layer;
a second electrode on a second side of the semiconductor layer, the second side being opposite the first side, the semiconductor layer including a device region and a first adjacent region adjacent to the device region, the first adjacent region including:
a first recess in the semiconductor layer that extends from the first side of the semiconductor layer toward the second side,
a first insulating layer disposed on a bottom surface of the first recess and on a sidewall of the first recess,
a second insulating layer disposed on the sidewall above the first insulating layer, the second insulating layer being thinner than the first insulating layer in a direction orthogonal to the sidewall,
a field plate electrode disposed on first insulating layer and the second insulating layer and having a second recess, the second recess extending from an upper surface of the field plate electrode towards the bottom surface of the first recess, and
a first layer disposed in the second recess and including a material that is different from a material of the field plate electrode;
the device region including:
a contact region in the semiconductor layer, the contact region being in direct electrical contact with the first electrode,
a gate electrode on the first side of the semiconductor layer and spaced from the semiconductor layer by a third insulating layer, the contact region being between the sidewall of the first recess and the gate electrode.

17. The semiconductor device according to claim 16, wherein the field plate electrode is primarily polysilicon.

18. The semiconductor device according to claim 16, wherein the field plate electrode is doped with phosphorus atoms.

19. The semiconductor device according to claim 16, wherein the first layer is an insulator.

20. The semiconductor device according to claim 16, further comprising:
a second adjacent region in the semiconductor layer and adjacent to the device region, the device region being between the first and second adjacent regions, the second adjacent region including:
a third recess in the semiconductor layer that extends from the first side of the semiconductor layer toward the second side,
a fourth insulating layer disposed on a bottom surface of the third recess and on a sidewall of the third recess,
a fifth insulating layer disposed on the sidewall of the third recess above the fourth insulating layer, the fifth insulating layer being thinner than the fourth insulating layer in a direction orthogonal to the sidewall of the third recess,
a second field plate electrode disposed on fourth insulating layer and the fifth insulating layer and having a fourth recess, the fourth recess extending from an upper surface of the second field plate electrode towards the bottom surface of the third recess, and
a second layer disposed in the fourth recess and including a material that is different from a material of the second field plate electrode.

* * * * *